US008189816B2

(12) United States Patent
Solow

(10) Patent No.: US 8,189,816 B2
(45) Date of Patent: May 29, 2012

(54) COMPUTER CONTROLLED AMPLIFIER AND SPEAKER SYSTEM WITH POWER CONSERVATION FEATURE

(75) Inventor: Stanley Solow, Plainview, NY (US)

(73) Assignee: Wolo Mfg. Corp., Deer Park, NY (US)

(*) Notice: Subject to any disclaimer, the term of this patent is extended or adjusted under 35 U.S.C. 154(b) by 959 days.

(21) Appl. No.: 12/133,948

(22) Filed: Jun. 5, 2008

(65) Prior Publication Data

US 2009/0003619 A1 Jan. 1, 2009

Related U.S. Application Data

(60) Provisional application No. 60/946,212, filed on Jun. 26, 2007.

(51) Int. Cl.
*H03F 99/00* (2009.01)

(52) U.S. Cl. .......... 381/120; 381/28; 381/111; 330/297; 330/123; 330/199; 330/136

(58) Field of Classification Search .................... 381/86, 381/120, 77, 28, 111; 330/297, 123, 199, 330/124 R, 136
See application file for complete search history.

(56) References Cited

U.S. PATENT DOCUMENTS

| | | | | |
|---|---|---|---|---|
| 5,081,426 | A * | 1/1992 | Imanishi | 330/296 |
| 6,424,875 | B1 * | 7/2002 | Yoon | 700/94 |
| 6,690,431 | B1 | 2/2004 | Yang et al. | |
| 6,970,571 | B2 * | 11/2005 | Knorr et al. | 381/370 |
| 6,983,052 | B2 * | 1/2006 | Kemmerer et al. | 381/86 |
| 7,116,168 | B2 * | 10/2006 | Makino et al. | 330/251 |
| 7,194,097 | B2 * | 3/2007 | Su et al. | 381/120 |
| 7,945,067 | B2 * | 5/2011 | Mott et al. | 381/334 |
| 8,024,055 | B1 * | 9/2011 | Holmgren et al. | 700/94 |
| 2005/0084118 | A1 * | 4/2005 | Schaupert et al. | 381/110 |
| 2006/0023896 | A1 * | 2/2006 | Ginsberg et al. | 381/94.8 |
| 2007/0140513 | A1 * | 6/2007 | Furge | 381/120 |
| 2007/0223738 | A1 * | 9/2007 | North | 381/104 |

OTHER PUBLICATIONS

Appln. No. 200810125771.8, Chinese Office Action issued Mar. 1, 2012, 10 pages.

* cited by examiner

*Primary Examiner* — Disler Paul
(74) *Attorney, Agent, or Firm* — Andrew F. Young, Esq.; Lackenbach Siegel, LLP

(57) ABSTRACT

A computer controlled amplifier and speaker system includes a power conservation feature allowing ready adaptation to a variety of consumer vehicles, audio systems, and individual consumer purposes. The computer controlled amplifier and speaker system includes an audio-signal detection and power on/off feature and accepts multiple audio inputs and enables multiple audio outputs while also allowing ready adaptation to a variety of power sources. A plurality of power supply functions are readily adapted to supply power to the amplifier and speaker system enhancing user convenience. The disclosed system may be readily adaptable to a portable kit allowing achievement of similar power conservation goals in diverse settings.

9 Claims, 6 Drawing Sheets

3
2
116, 116A
110
110B
To Vehicle Male Adaptor Clip
111
To Vehicle 12V DC System
1
Power Supply
115
To Vehicle Input Jack
110
110C
116, 116B
4
7
6
112A
8
5, 15

Operational Cycle
(time)

Operational Cycle
(time)

COMPUTER CONTROLLED AMPLIFIER AND SPEAKER SYSTEM WITH POWER CONSERVATION FEATURE

CROSS REFERENCE TO RELATED APPLICATION

This application claims priority to U.S. Prov. App. Ser. No. 60/946,212 filed Jun. 26, 2007, the entire contents of which are herein fully incorporated by reference.

BACKGROUND OF THE INVENTION

1. Field of the Invention

The present invention relates to a computer controller amplifier and speaker system having power conservation feature. More specifically, the present invention relates to a computer controlled amplifier and speaker system with an adaptable power conservation and power shut-off feature that accepts multiple audio inputs and enables multiple audio outputs and is adaptable to a portable kit.

2. Description of the Related Art

A number of conventional electric speaker systems are known that include the playing of a fixed book of songs or selected sounds retained in an electronic memory.

A first example of a conventional electric speaker system is the Model 336 sold by Wolo Manufacturing Corp. (identified at www.wolo-mfg.com, the contents of which are herein incorporated by reference). The Model 336 system includes an electronic speaker in operable connection with a controlling module and a power supply link for connecting directly to the 12 volt wiring harness for a vehicle. The controlling module includes a plurality of keys allowing a user to play any of the stored preprogrammed songs retained in an electronic memory and additionally enables a user to record and play one additional song. A LED (light emitting diode) light notes an on/off mode and a volume controller exists.

During use, the electric speaker for the Model 336 unit is fixably placed within the engine compartment of a vehicle and the controlling module is placed within the passenger compartment. The Model 336 operates to a maximum volume of 12 watts supplied by the vehicle's 12 volt electrical system, and is limited thereto.

A second example of a conventional electronic speaker system is the Model 345 also sold by Wolo Manufacturing Corp. (identified at www.wolo-mfg.com, the contents of which are again herein incorporated by reference). The Model 345 system includes an electric speaker in operable connection with a controlling module which includes a microphone, and a power source connection link for connecting directly to the vehicle's 12 volt wiring system or a battery for a vehicle. The controlling module includes a plurality of rotary control features, allowing a user to select and play via the electric speaker different pre-recorded animal sounds, electronic sirens, and musical songs stored in an electronic memory. The controlling module also allows the use of the microphone as a fixed audio input enabling a user to operate the electric speaker as a public address (P.A.) system.

As with the Model 336 system, the electric speaker for the Model 345 unit is fixably placed within the engine compartment of a vehicle and the controlling module is placed within the passenger compartment along with the microphone. The Model 345 also operates to a maximum volume of 12 watts powered by the vehicle's power system, and limited thereto.

These known, and related electronic horn devices have several disadvantages. Their operation can be too simplistic and therefore not responsive to consumer needs. In particular, they may not have any ability to accurately adjust to a required power level and also fail to provide any amplification of the stored or spoken audio signals over the maximum 12 watts of audio output powered by the vehicle's electronic system. Consequently, the power consumption of these systems may not be optimal for their use, due to the absence of any power conservation software and management features.

These conventional systems also fail to appreciate the need for readily adaptable power supply features, allowing an electric speaker or horn system to be employed in a non-12 Volt non-vehicle circumstance.

Furthermore, these systems do not permit the receipt or upload of audio content to a computer memory from audio signal systems (such as IPods® or MP3 players) outside the specific Model 336/345 systems in an on-demand basis. Similarly, these systems do not permit the output of audio content in the form of audio electronic driving signals to third party audio use systems such as separate home stereo systems, computers, camcorders, projectors, and public performance equipment.

Neither conventional system contemplates the need for an amplifying electronic speaker system that is adaptable to a variety of audio inputs, audio outputs, that maintains a controllable power conservation feature, and that is readily adapted to a portable use.

Accordingly, what is not appreciated in the related art is the need for a combined electric speaker and amplifier system with an operational controller, that readily accepts a variety of audio inputs and outputs, is adaptable to a variety of power supply systems, and that contains power conservation software to shut off an amplification of an audio output signal after detecting the end of a audio signal from an audio signal driver.

It will also be understood, that the present use of the phrase 'electric speaker' will be understood by those of skill in the art to be also an electronic speaker', recognizing here the interchangeability of the words electric and electronic for the consumer products discussed.

OBJECTIVES AND SUMMARY

A main objective is to provide a computer controlled amplifier and speaker system having a power conservation feature that overcomes at least one of the detriments noted above.

One preferred embodiment of the present invention relate to an installable electric speaker system having an electric speaker, a controller module with power conservation software, and an ability to receive a plurality of audio inputs and generate a plurality of audio outputs.

Another preferred embodiment of the present amplifier and speaker system includes a computer controlled power management function to manage power usage during periods of use and detected non-activation, and a readily programmable and re-programmable operating system.

The present invention provides a computer controlled amplifier and speaker system that includes a power conservation feature allowing ready adaptation to a variety of consumer vehicles (automobiles, boats, planes, motorcycles etc.), audio systems, and individual consumer transportation. The computer controlled amplifier and speaker system includes an audio-signal detection and power on/off feature and accepts multiple audio inputs and enables multiple audio outputs while also allowing ready adaptation to a variety of power sources. The disclosed system may be readily adaptable to a portable kit allowing achievement of similar power conservation goals in diverse settings.

In a first embodiment of the present invention, a computer controlled amplifier and speaker system is provided, comprising: a first housing further comprising: electronic means for generating a sound wave upon the receipt of an audio signal having a first amplification level, electronic means for amplifying the audio signal from the first amplification level to a second amplification level upon receipt of an amplification instruction, a control module, further comprising: control module means for transmitting the audio signal to the first housing and for transmitting the amplification instruction upon a trigger, power supply means for receiving an electrical operating voltage from at least one of a plurality of sources and for transmitting the same to the first housing, thereby enabling an operation of the electronic means for generating and for amplifying, a power controller module in the control module, the power controller module further comprising: audio control input means in the control module means for detecting an audio signal transmission by the control module to the first housing and for sending the trigger to the control module, and the audio control input means further comprising means for detecting a cessation of the audio signal transmission from the control module, or from a direct audio input source as will be explained) and for ending the sending of the trigger start a timing circuit to enter a power conservation mode to end the amplification instruction allowing entry of a power conservation or standby mode upon a user-selected time delay following the cessation, whereby the power controller module minimizes a need for power from the power supply means.

In a second embodiment of the present invention, a computer controlled amplifier and speaker system is provided, further comprising: an audio input means in electronic connection with the control module for receiving at least one of a plurality of audio inputs from an external audio signal source, whereby the computer controlled amplifier and speaker system may receive the audio signal.

In a third embodiment of the present invention, a computer controlled amplifier and speaker system is provided, wherein: the audio input means includes means for receiving the at least one audio input from at least one of a hand-held electronic device, and MP3 audio player, a compact disk (CD) player, a personal music device, a memory music device having one of a flash memory and a hard-disk memory, an electronic musical instrument having an audio signal output, an operating computer system, an operating audio/video system having a video and an audio output, and a stereo sound producing electronic system, whereby the audio input means enables the computer controlled amplifier and speaker system to accept an increased variety of audio inputs to improve user convenience and enjoyment of audio output.

In a fourth embodiment of the present invention, a computer controlled amplifier and speaker system is provided, wherein: the plurality of sources of the electrical voltage from the power supply means includes at least one of a 12 volt DC power from a battery, a 12 Volt DC power from a wiring system connected to a battery, an electronic power from one of an internal and an external battery supply system, a 110V AC power supply, a household power supply, a generator-provided power supply, and a connection means for connecting from each the sources of electrical voltage to the system.

In a fifth embodiment of the present invention, a computer controlled amplifier and speaker system is provided, further comprising: an audio output means in the control module for transmitting the audio signal additionally to a means for external transmission of the output audio signal to at least one of a plurality of external audio generators, whereby the system enables the generation and control of audio signals in the external audio generators.

In a sixth embodiment of the present invention, a computer controlled amplifier and speaker system is provided, wherein: the power controller module in the control module further comprising: input means for selecting and controlling at least one of a time delay of the sending of the trigger to end the amplification and a termination rate and a level of the means for amplifying from the second amplification level, whereby the input means for selecting enables a ready control of the timing and rate of reduction in amplification thereby allowing the power controller module to minimize a power consumption use (current) of the system during periods of non-use.

In a seventh embodiment of the present invention, a computer controlled amplifier and speaker system is provided, wherein: the first housing, the control module, the power supply means for receiving an electrical voltage, and the power controller module are positioned closely adjacent in a bounded and readily transportable case.

In an eight embodiment of the present invention, an amplifier and speaker kit is provided, comprising: an electronic means for generating a sound wave upon the receipt of an audio signal having a first amplification level and an electronic means for amplifying the audio signal from the first amplification level to a second amplification level upon receipt of an amplification instruction, a control module including control module means for transmitting the audio signal to the electronic means for generating and for transmitting the amplification instruction upon a trigger, power supply means for receiving an electrical voltage from at least one of a plurality of power sources and for transmitting the power to the electronic means for generating and the means for amplifying, a power controller module, the power controller module further comprising: audio control input means in the control module means for detecting an audio signal transmission by the control module to the means for generating and for sending the trigger to the control module, and the audio control input means further including means for detecting a cessation of the audio signal transmission from the control module and for ending the sending of the trigger to end the amplification instruction upon a user-selected or a predetermined time delay following the cessation, whereby the power controller module minimizes a need for the electrical current by switching or entering a standby-mode current from the power supply means.

In a ninth embodiment of the present invention, there is provided a sound amplification system, comprising: an electronic means for generating a sound wave upon an input of an audio signal having a first amplification level and an electronic means for amplifying the audio signal upon receipt of an amplification instruction from an audio circuit control input means, a power supply module operably supplying power to the electronic means for amplifying and for generating the sound wave, the audio circuit control input means including means for detecting the input of the audio signal and for initiating an amplification control circuit for transmitting the amplification instruction to the electronic means for amplifying the audio signal, and the means for detecting the input further comprising: means for detecting a cessation of the input of the audio signal and for ending a transmission of the amplification instruction upon a user-selected time delay following the cessation and for ending the supplying power to the electronic means for amplifying and for generating the sound wave, whereby the audio circuit control input means provides a power conservation function following the cessation of the audio signal.

The above, and other objectives, features and advantages of the preferred embodiments of the present invention will become apparent from the following description read in conduction with the accompanying drawings, in which like reference numerals designate the same elements.

DETAILED DESCRIPTION OF THE PREFERRED EMBODIMENTS

Figure 1:
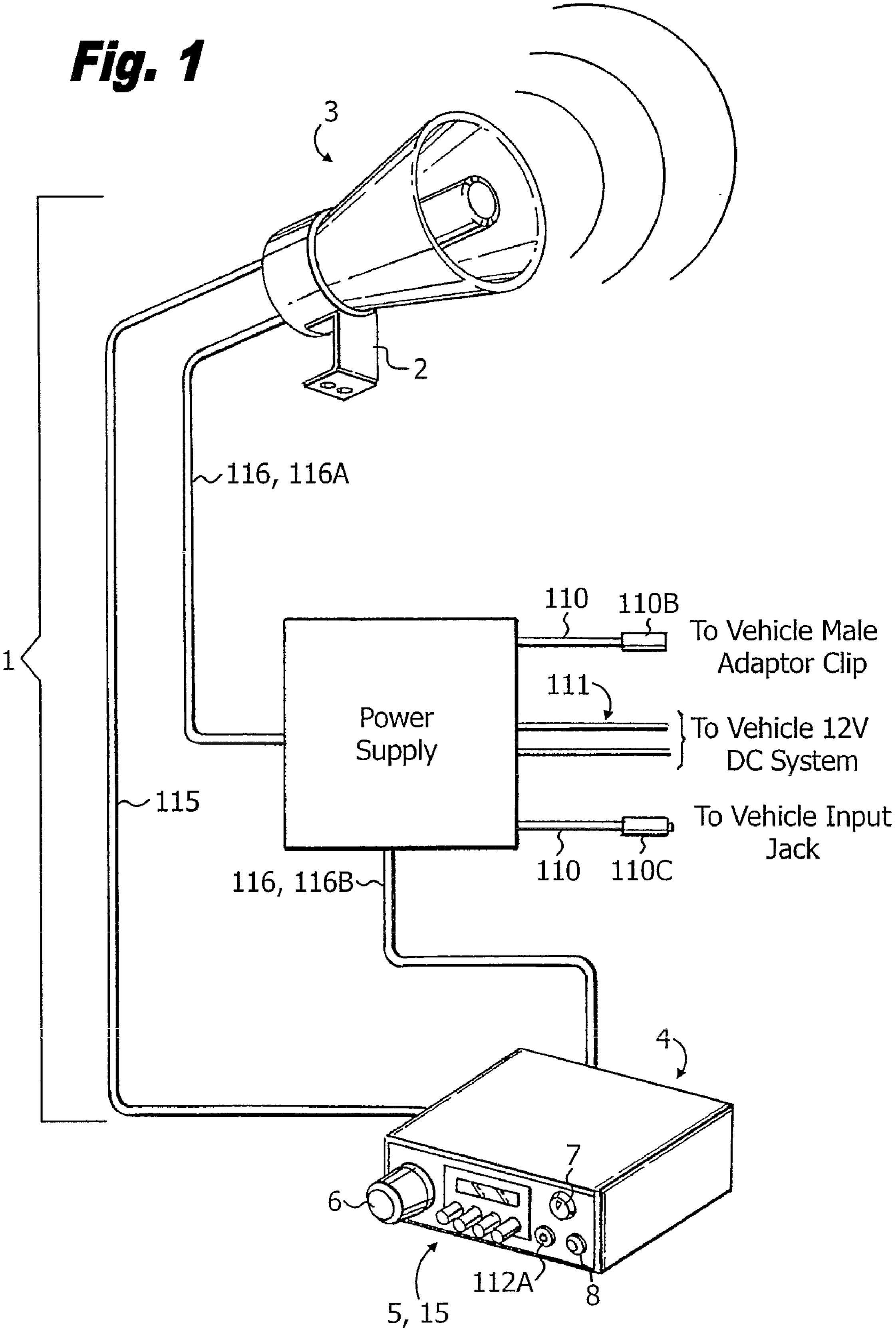
FIG. 1 is a schematic overview of a system according to the present invention.

Reference will now be made in detail to several preferred embodiments of the invention that are illustrated in the accompanying drawings. Wherever possible, the same or similar reference numerals are used in the drawings and the description to refer to the same or like parts or steps. The drawings are in simplified form and are not to precise scale. For purposes of convenience and clarity only those of skill in the art will recognize that directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but also include connections through intermediary elements or devices. Similarly, the words "store", or "transmit" do not necessarily direct an immediate action of storing or operating a transmitter, but shall include, for example, an understanding that an action will be indicated by a controlling device which may drive an external storage or transmitting device to actual conduct an action of storing or transmitting.

Referring now to FIG. 1, a first embodiment of a computer controlled amplifier and speaker system having a power conservation feature is shown at 1. Subcomponents of the overall system include a combined horn and amplifier system 3 having a mounting bracket 2, a control module 3 and a power supply system 116. As presently preferred the electronic amplifier circuitry is sealed in a watertight compartment near the diaphragm (not shown) in the combined horn and amplifier system 3, but alternative positions and constructions of the amplifier circuitry may be employed without departing from the scope and spirit of the present invention. It shall be recognized, that the power supply system 116 provides a power to both control module 4 and combined horn and amplifier system 3, as will be discussed in more detail later.

The present embodiment of control module 4 provides a controlling link 115 for audio signals and amplification signals generated by a micro control module (MCM) or computer control module (CCM) within control module 4 that performs and enables a plurality of electronic functions, as will be discussed.

As a unique feature of the present invention, system 1 may operate with and readily adapts to a plurality power supplies via power supply system 116, which alternatively may include a separate power supply 116A to speaker and amplifier system 3 and a separate power supply 116B to control module 4, as shown. Functionally, those of skill in the art will recognize that system 1 may be supplied with power via a plurality of circuit designs and power supply arrangements without departing from the scope and spirit of the present invention. For example, power may be supplied in parallel, in series, or independently (or any combination of the same) respectively to system 3 and module 4 without departing from the scope and spirit of the present invention.

As a unique feature of the present invention, power supply system 116 is adapted to receive power from a plurality of sources, including (a) direct connection via wires 111 to a vehicles 12 Volt DC power system (either to the wiring harness at a select location or to a battery (both not shown)), (b) connection via a male 12 volt power input jack 110C (such as a cigarette lighter) at an end of a 12 volt power lead 110, (c) connection via a 12 volt power input lead 110 having a female adaptor clip 110B known to those of skill in the art connectable to a male adaptor clip 110B (shown later) that may in turn be connected to a DC power supply system of a vehicle, (d) a 110 volt AC transformer input 109 (shown in FIG. 5) allowing connection to a system supplied voltage, and (e) a stand alone battery supply (outside system 1) or an internal battery supply in either system 3 or control module 4 (both not shown).

It will be recognized by those of skill in the art that any form of conventional adaptor, and as required transformer, or battery supply may be employed in connecting power supply input 116 of system 1 to a power supply without departing from the scope and spirit of the present invention. For example, a user may choose to connect system 1 to a separately supplied gas powered generator (not shown) generating a 110V AC current and having a battery back-up capacity via power supply input 116 without departing from the scope and spirit of the present invention.

Control module 4 includes an operable control panel 5 (as will be discussed), a light emitting diode (LED) indicator 7 indicating an operating condition of system 1 (on/off), an audio input 8 for receiving an audio input separately via a conventional bayonet jack (⅛ inch or ¼ inch diameter), a USB or mini-USB input jack, or any other conventionally known electronic audio connections and audio data transfer connections known to those of skill in the art.

A volume control mechanism 6 is provided in a readily accessible manner, such as a control button, a knob, or a switch without departing from the scope and spirit of the present invention. A power on/power off control is shown here included in volume control mechanism 6, but may be provided separately upon a manufacturing desire of the same without departing the scope and spirit of the present invention.

An additional novel feature of the present invention is a feature of the control module, and particularly the micro control module (not shown) to adaptively receive any one of a plurality of audio signals in any format via the audio input 8 from, for example an MP3 player, an I-Pod, a Compact Disk (CD) Player, a Citizen Band (CB) radio/transmitter, a personal computer, an electronic keyboard, an electronic instrument (guitar or drums for example) or any other type of device presently known or to be created in the future that generates an electronic audio signal that may be transmitted to audio input 8 via a conventional bayonet jack or USB/mini-USB jack. Upon receiving such an audio input signal from audio input 8, control module interacts with inputs form control panel 5 and from power control module circuitry (to be discussed) within control module and generates an instructive audio signal via audio signal connection 115 to amplifying and speaker system 3. Those of skill in the art will also recognize that the present control module 4 may be readily connected either via audio input 8 or via a separately provided direct-wire connection, using the wire provided or a female socket directly on speaker system 3, or directly to vehicle's audio stereo system without departing from the scope and spirit of the present invention.

In combination, those of skill in the art will recognize that the present system 1 is capable of receiving operational power from any conventionally known power supply source and from receiving an audio signal from any system generating an audio signal and for driving a controlling audio signal to combined speaker and amplifying system 3.

Control panel 5, 115, is a representative panel that may be readily adapted to include or un-include a plurality of indicators, control switches, selectors, indicators, and readouts or displays to accomplish the following alternative and optional goals without departing from the scope of the present invention.

Control panel 5, 115 allows a user to select from a plurality of pre-recorded and electronically stored sounds, audio files (of any kind including midi-files), any form of user-generated sound via a microphone (not shown) connected via audio input 8, any form of designated power supply input, a time remaining or used on an audio file, a volume designation or illustration of the same, a sound balancing and tone control feature, a feature to control and select and operate the power conservation system herein (by selecting optionally a delay time to start amplification, a delay time to end amplification, to control a form or a type of application, a control or form of the decrease in amplification, a type of audio signal to detect, and other electronic control features as will be required to conduct the operations discussed herein).

Figure 2:
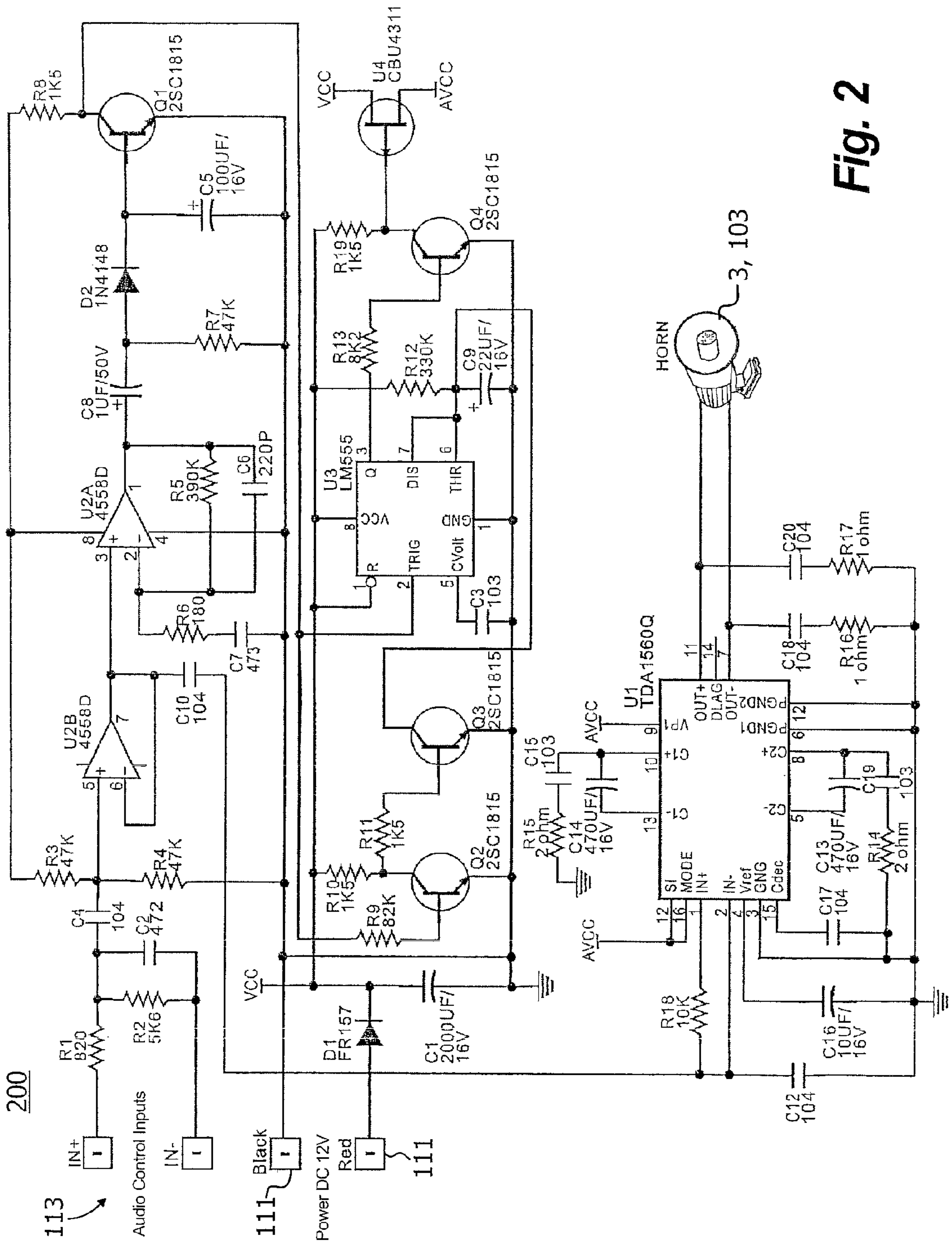
FIG. 2 is a circuit diagram of one aspect of the horn system according to another aspect of the present invention.

Referring now to FIG. 2, an alternative control and operational circuit 200 for one aspect of the present computer controlled amplification and speaker system 200 containing a speaker and amplification system 3, 103, power supply leads 111, 111 and audio control inputs 113. While the goals of the present system 1 may be accomplished by a plurality of alternative circuitry configurations without departing from the scope and spirit of the present invention, those of skill in the art of circuitry design will recognize that FIG. 2 presents one alternative circuitry arrangement in line with the present invention.

Figure 2A:
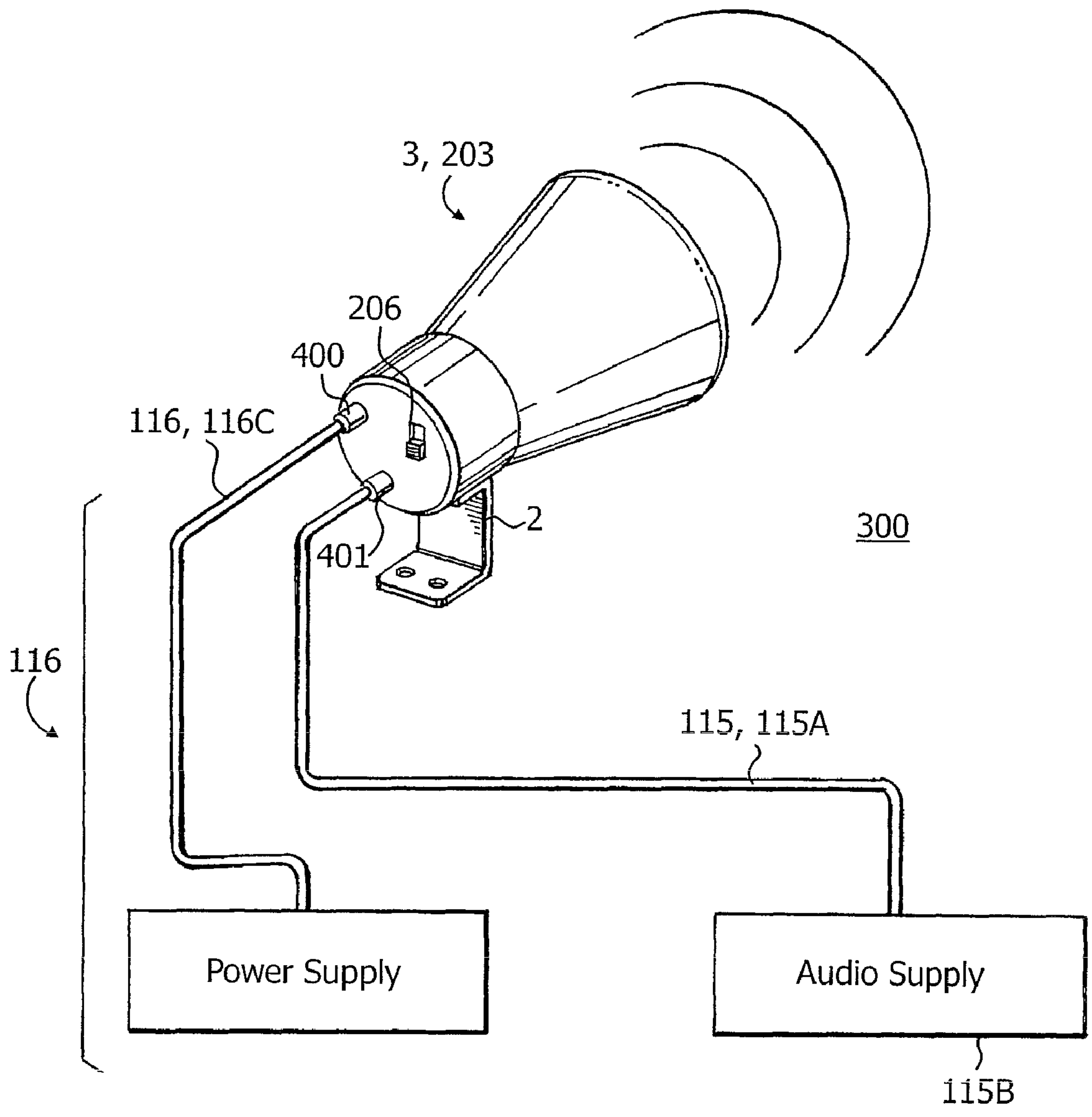
FIG. 2A is an alternative schematic overview of a system according to another embodiment of the present invention.

Referring now to FIG. 2A, an alternative controlled amplifier and speaker system 300 contains a combined computer controlled speaker and amplification system 3, 203 as well as a built in control module (not shown), the system containing a power conservation features, as will be discussed. As with the embodiment noted in FIG. 2 above, the present embodiment provides an example of alternative design and circuitry configurations that are adapted to achieve the noted goals herein without departing from the scope and spirit of the present invention.

As will be recognized by those of skill in the art, the present system includes a combined speaker and amplifier system 3 having a mounting bracket 2 as well as control and electronic amplifier circuitry sealed in a watertight compartment near the diaphragm (not shown) in the combined horn and amplifier system 3. While the embodiment shown in FIG. 1 noted that the control circuitry may be positioned apart from the electronic speaker, or even in two parts (in a separate control module and in the speaker system), the present embodiment positions all of the control circuitry in the speaker and amplifier system 3, 203.

In the instant embodiment, the power supply system 116 is adapted to provide via a power supply line 116C directly to system 3, 203. It is noted that power supply system 116, 116C is specifically noted herein as being of any type of power supply system noted throughout this discussion and may include all of the types of physical connection, adaptation, transformative, voltage-adaptation, and battery back-up options that may be needed by a manufacturer or requested by a customer. For example, power supply 116, 116C is graphically illustrated as merely having a power supply line connecting to a power supply port 400 in system 3, but this connection may be hard-wired, removably connected, or joined or supplied in any other means know to those of skill in the electronic and power supply connection arts after having reviewed the present disclosure.

Additionally noted herein, is the employment of a representative audio supply or audio signal provider 115B representing any form of audio signal generator discussed in the present disclosure or known to those of skill in the audio arts. Such an audio signal generator may be, for example, an MP3 player, and I-Pod, a DVD system, etc. that generates an audio signal and has an output or an input, such as, by way of further example, a bayonet jack, or a USB or mini-USB jack enabling an electrical connection to receive an audio signal. Audio signal provider 115B is recognized as being within an overall audio signal driving connection 115, containing in the present example, a simple dual-male ended bayonet jack connection 115A, joining a female audio input 401 on system 3, 203 and audio signal provider or supply 115B.

Here, it is recognized that the control circuitry within speaker and audio system 3, 203 also contains a form of micro control module (MCM) or computer control module (CCM) that performs or enables a plurality of electronic functions, including recognizing the input of an incoming audio signal, the ending of such an audio signal, and the initiation and termination of an amplification instruction issued to the contained amplification circuit system (not shown). Obviously, the electronic functions enabled include operation according to the entire scope of the present invention depending upon the controlling software. As one adaptation to the present embodiment, a stand alone power control switch 206 may be provided on an exterior surface of electronic speaker system 3, 203.

It will also be readily recognized, that unlike the initial embodiment noted in FIG. 1, power supply 116, 116C is not required for audio supplier 115B which may be separately powered, for example by a battery or by an outside system power supply. Consequently, one alternative aspect of the present invention includes a power supply system (from any power-supply source), a speaker/amplifier, control system 3, 203, and an audio supply system supplying an audio signal (from any audio source), as shown in FIG. 2A, all without departing from the scope of the present invention.

Under the present construction, speaker and amplifier and controller system 3, 203 includes the audio signal detection and power conservation circuitry noted earlier, which operates in the manner discussed hereafter. Consequently, while an external module control may not be included, it will be recognized by those of skill in the programming arts, that such audio signal detection circuitry, timing circuitry, and amplification control circuitry may be operationally included in system 3, 203 without the need for external volume displays, etc. and without departing from the scope of the present disclosure.

In the present embodiment, no specific volume control feature is externally provided, but it will be recognized that the amplification power supplied will be proportional to the incoming audio signal up to a system designated maximum (here 40 watts). Greater amplification power may be supplied without departing from the scope of the disclosure. Similarly, as with the embodiment above, audio signal driving connection 115, 115A can receive audio signals from any known or to be developed format without departing from the scope of the present disclosure.

Figure 3:
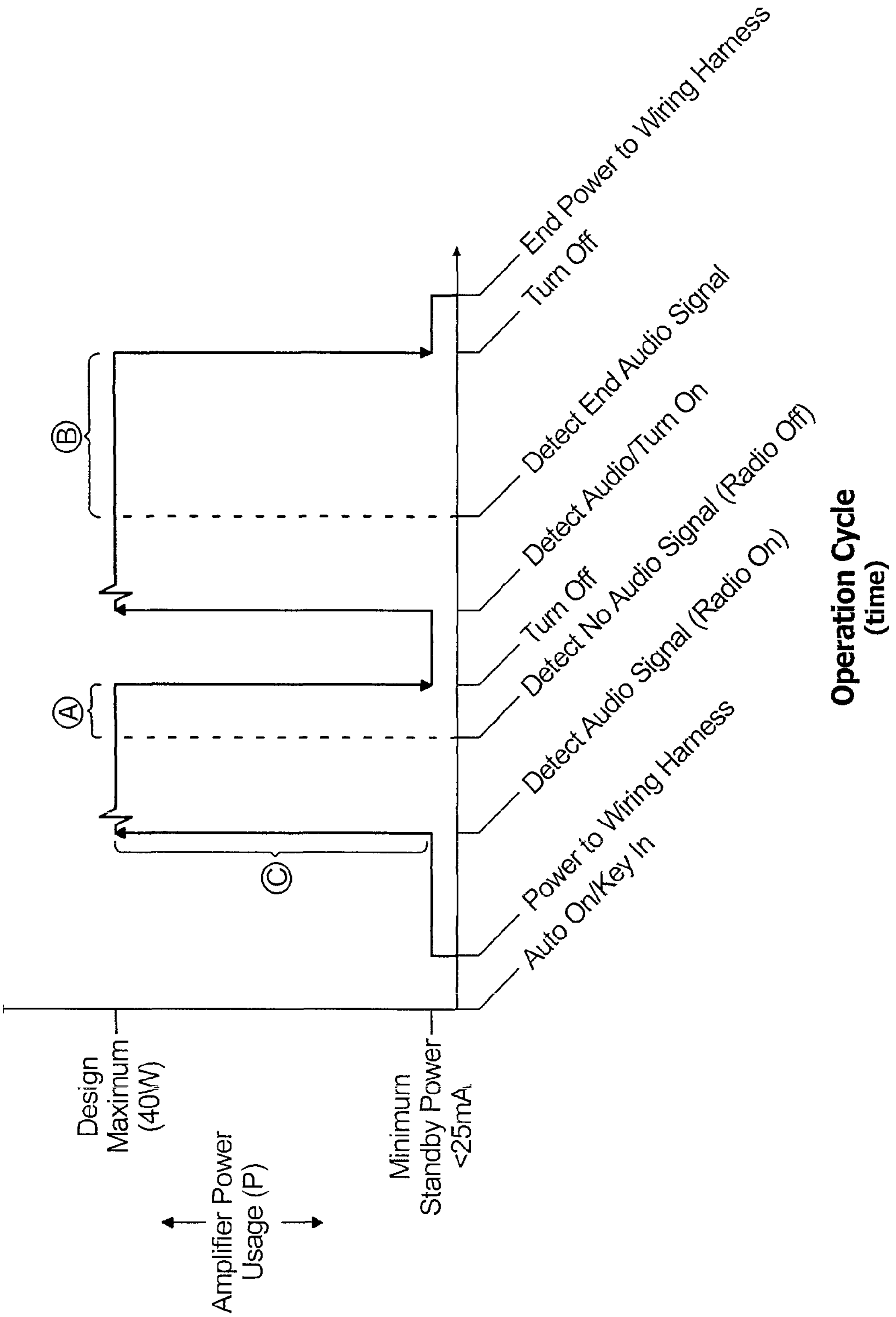
FIG. 3 is an illustrative graphical representation of an operational cycle a system according to another aspect of the present invention.
Figure 3A:
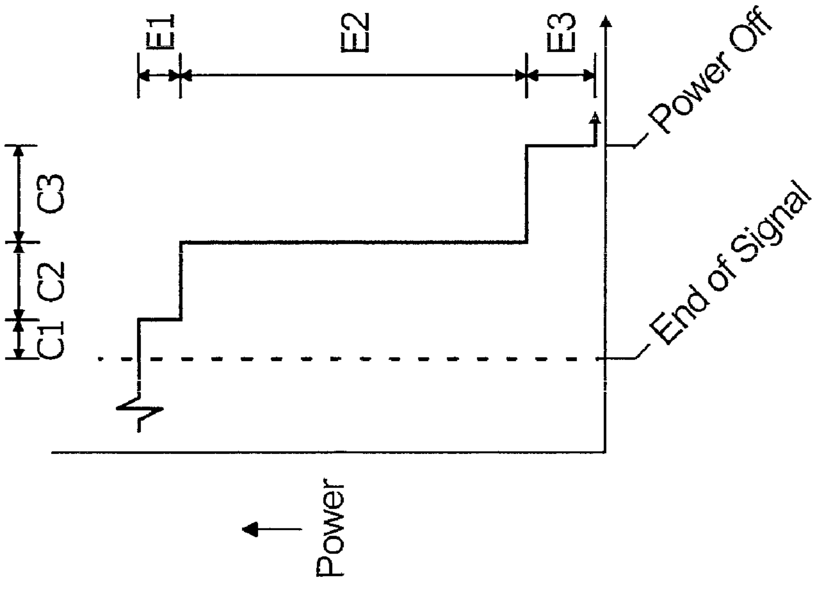
FIGS. 3A and 3B are illustrative graphical representations of alternative shut-down operational cycles according to adaptations of the present invention.
Figure 3B:
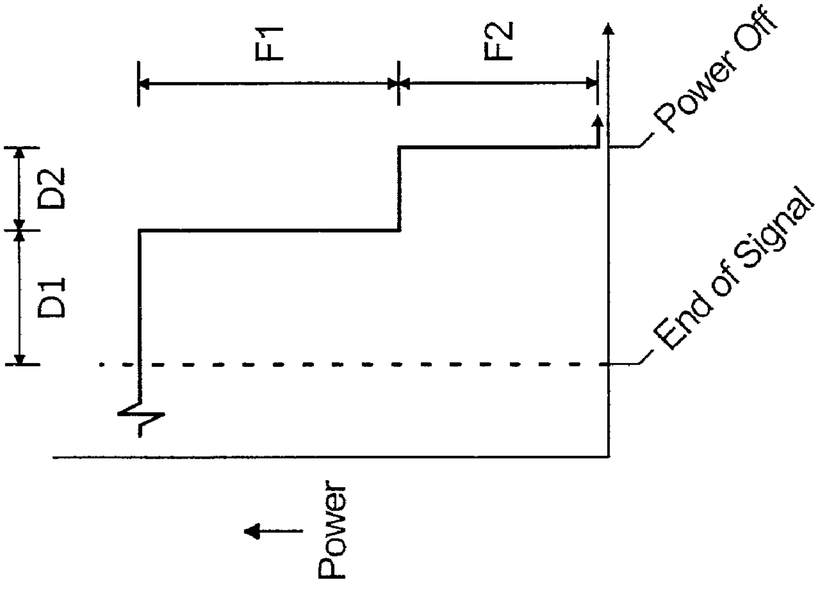

Referring now to FIGS. 3, 3A and 3B an operation of the power conservation feature within systems 1, 200, 300, or the other systems noted herein, is discussed in further detail. While the descriptive focus will employ as an example the embodiment in FIG. 1 (system 1) with controller 4, it is to be recognized that the power control, timing circuits, and functions may readily be managed within speaker, amplifier, controller system 3, 203, within speaker system 3, 103, or the portable system noted in FIGS. 4 and 5, all without departing from the scope and spirit of the present invention. As noted earlier, the internal power conservation circuit may operate in a variety of ways without limitation herein, and the following figures are intended to be representative examples only.

Specifically referring now to FIG. 3, a system 1 installed in a vehicle is connected via power supply system 116 to the vehicle power harness for 12 V DC power or 110V AC transformer. Upon a power supply to the wiring harness, control circuit operates system 1 to initiate a "stand-by mode" for system 3, using minimal current—the figure of 25 mA is suggested but more or less is readily used depending upon the system used.

Next, the user installs a wire jack connector into the audio headphone socket of an MP3 player and connects the other end of the wire jack connector into the audio input jack 8, or where speaker system 3 is employed alone, into a receiving jack connector on speaker system 3, and turns on the MP3 player enabling the generation an audio signal.

Next, the user turns on power to system 1 via power control 6 (combined with volume control in this embodiment) and an audio signal occurs.

Control module 4 and power conservation controller (not shown) detects the power on status and the audio signal input-on from the MP3 player and recognizing the existence of the audio signal, switches modes from "stand by" to "amp on" and triggers the amplifier via controller connection 115 to turn on and draw power from power supply system 116, thereby allowing a substantial increase (as shown by C in FIG. 3) in available power for generating audio volume. A user may then adjust heard volume according to volume control 6. It will be noted by those of skill in the art that during the "amp on" mode, the actual power draw is determined by the proportional settings of the output of system 3 (volume increases and current/power draw increases, and vice versa). As an effective result, the available power is now greatly enhanced and responsive to the volume setting.

After a use period, a user may turn off the MP3 player and end audio input via audio input 8, and a timing circuit begins timing at the cessation of the audio signal for a period of time A, designated by the manufacturer or adjusted and selected by a user via control panel 5. Following the cessation of the audio signal and the time-out period, system 1 triggers a shut off mode to the "stand by mode" to conserve power drawn by the amplifier.

Thereafter, the user determines a desire to remove the MP3 player (and any other type of audio signal generator) and selects a preset song or sound from the computer memory and plays the same thereby generating an internally recognizable audio signal, thereby causing the power conservation module and system to again enter "amp on" mode and trigger the amplifier to draw proportional power (here shown as the maximum C) for generating volume.

Again following the scenario shown in FIG. 3, the designated song ends and the control module detects the end of the audio signal, and after the pre-selected time, times the system 1 out and shuts down returning to stand-by mode.

Thereafter, on the right hand side of FIG. 3, the user turns off the vehicle, removes the keys, and ultimately ends power supply to system 1 via the wiring harness of the vehicle.

It will be recognized by those of skill in the art that a similar sequence of events may be readily supported where a user merely turns a vehicle engine off, turning off a stereo audio signal, and allowing power conservation circuit to time-out enter the "stand by" mode and turn off the amplifier, thereby preventing continuous high power drain by the amplifier from the vehicle's 12 V DC battery (if the system is connected to the battery).

Specifically referring now to FIGS. 3A and 3B, those of skill in the art of designing control circuits in audio systems will recognize that the shut-down/stand-by operation of the power conservation circuit may follow a series of alternative time steps (C1, C2, C3 and D1, D2) and a series of power reduction steps (E1, E2, E3 and F1, F2) without departing from the spirit and scope of the present invention.

Those of skill in the art will also recognize that the timing cycles and durations and power steps operationally controlled by control module 4 may be set by a manufacturer and be non-selectable by a user or alternatively fully controllable by a user all without departing from the scope and spirit of the present invention.

Figure 4:
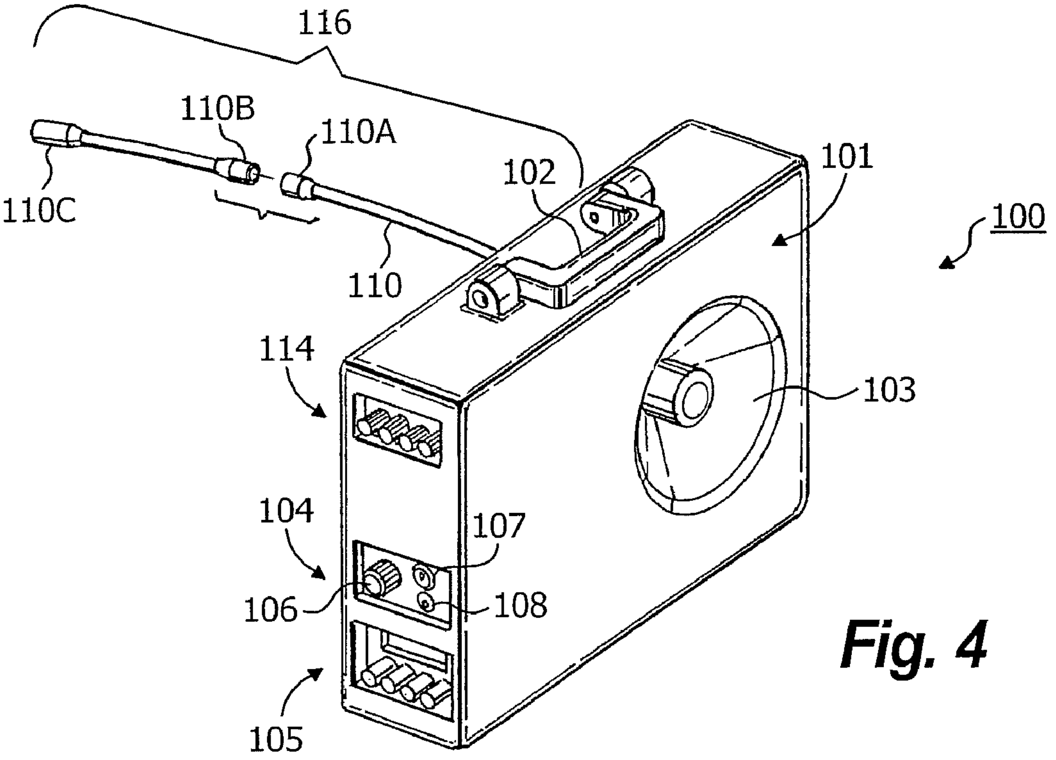
FIGS. 4 and 5 are perspective views of alternatively left and right perspective sides a portable kit containing the present system according to another embodiment of the present invention.
Figure 5:
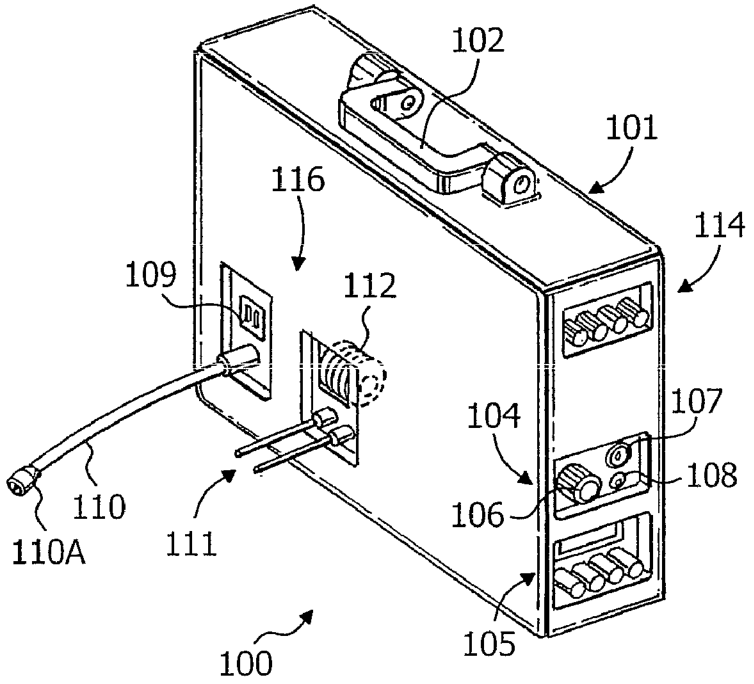

Referring now to FIGS. 4 and 5 a fully transportable and portable system 100 is provided that fully contains the main elements of system 1 noted above within an outer transport case 102 having in this example a handle 102.

As shown, a retained amplifier and speaker system 103 is functionally controlled by an operational control module 104 having an amplifier controller 114 (with control features such as cut-off timing and a cut off control), a volume control 106 having a power control build in, a control panel 105 functioning as noted above, an operational LED indicator 107, an audio input 108 as discussed above, and collectively a power supply system 116 containing the aforementioned connections for power supply. Possible connections for power supply include a 110V AC input 109, 12V power input jack 110, and 12V DC direct leads 111, and a battery supply pack internal to outer case 101.

As shown is a retractable spooled audio output jack connector 112 in operable connection with control module 104, allowing system 100 to connect with and control or generate an audio signal to; for example, a home stereo system, a portable music player (boom box), a vehicle audio input system etc., in the manner noted above to generate an audio signal from an installed audio player via audio input 108 (such as an MP3 Player).

As a consequence of the present system 100, those of skill in the art will recognize that the above, noted advantages of power conservation and ready adaptability to amplified audio signals as discussed above, can be provided in a portable case 101 without departing from the scope of the present invention.

As will be obvious to those of skill in the art of design consumer electronic devices, control module 4, 104 will include a housing that supports multiple internal mountings for necessary electronic components and a power supply controls.

It will be further recognized, that while indicators 7, 107 are noted as LEDs, the indicators are not restricted thereto, and systems 1, 100 may alternatively include an LCD display (organic OLED), plasma display, or any other type of image display as may be developed within the future that is suitable for the particular purpose herein without departing from the scope of the present invention.

Similarly, a touch screen display and interface system may be integrated in a manner consistent with the power management and control module systems discussed herein. Thus, while minor adaptations would be made to operate systems 1, 100, such adaptations do not teach away from the present invention, but are merely other embodiments of the same invention.

Similarly, instead of a single button or switch 6, alternative embodiments may have a plurality of buttons or switches to accomplish the stated functions. If so, the switches or buttons can be implemented with different respective functions. For example, one switch may operate an "on" function, while another switch may provide for a "timed power-down control".

It is also recognized that FIG. 2 is merely a presently preferred circuit diagram within systems 1, 100, and this diagram is not exhaustive of all the electrical components used or their arrangement within systems 1, 100, 300, etc. Schematic diagrams of this type are intended to be exemplary, non-limiting, implementations of the electronics and circuitry for system indicated. Consequently, skill users will note that control modules 4, 104 may readily include stored software and hardware utilized to operate according to the functions and the manners described herein but having different schematic diagrams and circuitry designations. There may be additional processors, RAM or ROM memory devices or both including NAND/NOR flash type memory, masked ROM, or a hard drives, or any other storage medium for storing control and operation information, audio data and power control data.

It is also noted that the presently discussed power conservation software includes a low standby current design for use when systems 1, 100 are not in actual operation or receipt of an audio signal but are powered during connection to an active power source and turned on. Additionally, a manufacturer install controlling software that keeps the systems in a standby condition when a pre-determined quantity of "on" activations occurs in a series of short time periods to prevent excessive use, without departing from the scope and spirit of the present invention.

In a discussion of the timing and sensing circuits herein, it will be recognized that software processing may be added to the system to better detect such audio signals, not merely upon an initial use of an audio signal, but whether the audio signal is sustained over a determined period. For example, it is desired that when an audio signal is first initiated and detected, a false signal is possible causing substantial feedback and potentially amplification failure. Thus, to accomplish this goal, software in the system (in the controller units, in the amplification units, or elsewhere) may optionally process the audio sensor depending upon an interval of detection by the audio signal. If the detection interval is sufficiently large, it may be assumed that the user wishes to engage amplification. If the interval between subsequent detections is small, or there are repeated detections in a short period of time, it may be assumed that false audio signals are being sensed and the device should be not be awakened from it's sleep mode, and the device should not be turned on despite a detection of an audio signal by an audio sensors. Furthermore, the logic applied to sensing the audio signals need not always be the same and may be dynamically adjusted during operation of the device. For example, the device can be programmed at an initial vehicle start-up to employ a short interval for sensing an audio signal, and after continued long vehicle use may employ a longer interval to determine when the device is awakened from sleep mode by an audio signal.

Those of skill in the art will recognize that while there are other benefits, two noteworthy advantages of the embodiments are as follows. The first is extremely low power usage or conversely super-efficient power consumption management. While internal power usage modes and a preferred power conservation regime was discussed above, those of skill in the art will also recognize that the present unit may easily be adapted to operate from a central power (AC) supply—either as a back up to or as a main power supply to a portable system 1.

The second benefit in the preferred embodiments of the present invention is that no particular software coding required to update the fields or operational software, and this may be provided in a variety of ways throughout the supply chain. In other words the electronic controls allow personalized updating on a unit-by-unit basis (for example via internet-download) without the need for an expensive product recall for problems, or an extensive marketing campaign to respond to a software glitch.

Finally, while the present discussion involves the use of selected connection systems for audio signals (for example the bayonet or USB port systems), nothing is limited thereto, and any other form of wired, wireless, or other audio signal connection system may be employed without departing from the scope of the present disclosure.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A computer controlled amplifier and speaker system, comprising:

a first housing comprising:

an electronic circuit for generating a sound wave upon the receipt of an audio signal having a first amplification level;

an electronic circuit for amplifying said audio signal from said first amplification level to a second amplification level upon receipt of an amplification instruction and for withdrawing electric power in accordance to said amplification instruction;

a control module for transmitting said audio signal to said first housing and for generating said amplification instruction upon an electronic trigger in accordance with a user volume's input and a status of a power supply;

a power supply for providing electrical power in according with said amplification instruction and for receiving an electrical power from at least one of a plurality of sources and for transmitting and connecting said electronic power to said first housing, thereby enabling an operation of said electronic circuit for generating and said electronic circuit for amplifying; and a power controller module in said control module, said power controller module further comprising:

an audio control input circuit in said control module for detecting an audio signal transmission by said control module to said first housing and for sending said trigger to said control module; and wherein said audio control input circuit detects a cessation of said audio signal transmission from said control module and ends the sending of said trigger to end said amplification instruction upon a time delay following said cessation, whereby said power controller module minimizes a need for said electronic power from said power supply.

2. A computer controlled amplifier and speaker system, according to claim 1, further comprising:

an audio input circuit in electronic connection with said control module for receiving at least one of a plurality of audio inputs from an external audio signal source, whereby said computer controlled amplifier and speaker system may receive said audio signal.

3. A computer controlled amplifier and speaker system, according to claim 2, wherein:

said audio input circuit receives said at least one audio input from at least one of a hand-held electronic device, and MP3 audio player, a compact disk (CD) player, a personal music device, a memory music device having one of a flash memory and a hard-disk memory, an electronic musical instrument having an audio signal output, an operating computer system, an operating audio/video system having a video and an audio output, and a stereo sound producing electronic system, whereby said audio input circuit enables said computer controlled amplifier and speaker system to accept an increased variety of audio inputs to improve user enjoyment.

4. A computer controlled amplifier and speaker system, according to claim 1, wherein:

said plurality of sources of said electrical power for said power supply includes at least one of a 12 volt DC power from a battery, a 12 Volt DC power from a wiring system connected to a battery, an electrical power from one of an internal and an external battery supply system, a 110V AC currently supply, a household power supply, a generator power supply, and a connector for connecting each said source of electrical power to said system.

5. A computer controlled amplifier and speaker system, according to claim 1, further comprising:

an audio output circuit in said control module for transmitting said audio signal for external transmission of said output audio signal to at least one of a plurality of external audio generators, whereby said system enables the generation and control of audio signals in said external audio generators.

6. A computer controlled amplifier and speaker system, according to claim 1, wherein:

said power controller module in said control module further comprising:

input circuit for selecting and controlling at least one of a time delay of said sending of said trigger to end said amplification and a termination rate and a level of said amplifying from said second amplification level, whereby said input circuit for selecting enables a ready control of the timing and rate of reduction in amplification, thereby allowing said power controller module to minimize a power use of said system during periods of non-use.

7. A computer controlled amplifier and speaker system, according to claim 1, wherein:

said first housing, said control module, said power supply for receiving an electric power, and said power controller module are positioned closely adjacent in a bounded and readily transportable case.

8. An amplifier and speaker kit, said kit comprising:

an electronic circuit for generating a sound wave upon the receipt of an audio signal having a first amplification level and an electronic circuit for amplifying said audio signal from said first amplification level to a second amplification level upon receipt of an amplification instruction and for withdrawing electric power in accordance to said amplification instruction;

a control module for transmitting said audio signal to said electronic circuit for generating said amplification instruction in accordance with a user volume's input and a status of a power supply and for transmitting said amplification instruction upon a trigger;

a power supply for receiving an electrical power in according with said amplification instruction from at least one of a plurality of power sources and for transmitting said power to said electronic circuit for generating and said electronic circuit for amplifying;

a power controller module, said power controller module further comprising:

an audio control input circuit in said control module for detecting an audio signal transmission by said control module to said circuit for generating and for sending said trigger to said control module; and said audio control input circuit further detects a cessation of said audio signal transmission from said control module and for ending the sending of said trigger to end said amplification instruction upon a user-selected time delay following said cessation, whereby said power controller module minimizes a need for said electronic power from said power supply.

9. A sound amplification system, comprising:

an electronic circuit for generating a sound wave upon an input of an audio signal having a first amplification level and an electronic circuit for amplifying said audio signal upon receipt of an amplification instruction from an audio control input circuit and for withdrawing electric power in accordance to said amplification instruction;

a power supply module operably supplying power to said electronic circuits for amplifying and for generating said sound wave in according with said amplification instruction and;

said audio control input circuit for detecting said input of said audio signal and for initiating an amplification control circuit for generating said amplification instruction in accordance with a user volume's input and a status of said power supply and transmitting said amplification instruction to said electronic circuit for amplifying said audio signal; and said audio control input circuit further detecting a cessation of said input of said audio signal and for ending a transmission of said amplification instruction upon a user-selected time delay following said cessation and for ending said supplying power to said electronic circuits for amplifying and for generating said sound wave, whereby said audio control input circuit provides a power conservation function following said cessation of said audio signal.

* * * * *